United States Patent
Martemucci et al.

(10) Patent No.: US 12,394,464 B2
(45) Date of Patent: Aug. 19, 2025

(54) HYBRID FeRAM/OxRAM DATA STORAGE CIRCUIT

(71) Applicant: COMMISSARIAT A L'ENERGIE ATOMIQUE ET AUX ENERGIES ALTERNATIVES, Paris (FR)

(72) Inventors: Michele Martemucci, Grenoble (FR); François Rummens, Grenoble (FR); Elisa Vianello, Grenoble (FR); Tifenn Hirtzlin, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 156 days.

(21) Appl. No.: 18/379,132

(22) Filed: Oct. 11, 2023

(65) Prior Publication Data
US 2024/0135979 A1 Apr. 25, 2024
US 2024/0233794 A9 Jul. 11, 2024

(30) Foreign Application Priority Data

Oct. 20, 2022 (EP) ..................................... 22306587

(51) Int. Cl.
*G11C 11/22* (2006.01)

(52) U.S. Cl.
CPC ...... *G11C 11/2273* (2013.01); *G11C 11/2255* (2013.01); *G11C 11/2257* (2013.01)

(58) Field of Classification Search
CPC ............ G11C 11/2273; G11C 11/2255; G11C 11/2257; G11C 11/2275; G11C 13/004;
(Continued)

(56) References Cited

U.S. PATENT DOCUMENTS

| | | | |
|---|---|---|---|
| 2006/0041711 A1* | 2/2006 | Miura | G11C 11/005 711/104 |
| 2012/0256653 A1* | 10/2012 | Cordero | H03K 19/17752 326/16 |

(Continued)

OTHER PUBLICATIONS

Yu, et al., "RRAM for Compute-in-Memory: From Inference to Training", IEEE Transactions on Circuits and Systems I: Regular Papers, vol. 68, Issue: 7, pp. 2753-2765, 2021.
(Continued)

*Primary Examiner* — Michael T Tran
(74) *Attorney, Agent, or Firm* — BakerHostetler

(57) ABSTRACT

A data storage circuit includes a first memory array comprising a plurality of FeRAM memory units; a second memory array comprising a plurality of OxRAM memory units; each of the first and second memory arrays comprising: a plurality of word lines, a plurality of source lines and a plurality of bit lines; for each column each memory unit comprising: a memory cell having a first electrode and a second electrode connected to the source line associated to the memory unit; a selection transistor having a gate connected to the word line associated to the memory unit and placed in series with the memory cell between the source line and a bit line associated to of the memory unit; the data storage circuit comprising further: a data transfer stage configured to transfer data from a set of source FeRAM memory units having a common bit line to a target OxRAM unit by converting a read signal from the common bit line to a transfer voltage applied on a target line of the target OxRAM unit; the target line corresponding to the word line or the source line and having the same direction as the common bit line.

15 Claims, 13 Drawing Sheets

(58) Field of Classification Search
CPC . G11C 11/005; G11C 13/0007; G11C 11/221; G06N 3/065; G06N 3/08
USPC .................................................. 365/148, 158
See application file for complete search history.

(56) References Cited

U.S. PATENT DOCUMENTS

| | | | |
|---|---|---|---|
| 2014/0157078 A1* | 6/2014 | Danilak | G06F 11/1048 714/773 |
| 2015/0137060 A1* | 5/2015 | Sun | H10D 8/60 257/471 |
| 2017/0213869 A1* | 7/2017 | Read | H10B 63/80 |
| 2019/0019564 A1 | 1/2019 | Li et al. | |
| 2022/0214805 A1 | 7/2022 | Basu et al. | |

OTHER PUBLICATIONS

Max, et al., "Interplay between ferroelectric and resistive switching in doped crystalline HfO2", J. Appl. Phys., vol. 123, 134102, 2018.

* cited by examiner

HYBRID FeRAM/OxRAM DATA STORAGE CIRCUIT

CROSS-REFERENCE TO RELATED APPLICATION

This application claims priority to foreign European patent application No. EP 22306587.1, filed on Oct. 20, 2022, the disclosure of which is incorporated by reference in its entirety.

FIELD OF THE INVENTION

The present invention relates to the implementation of computing circuits comprising non-volatile memories. Specifically, the invention regards the implementation of a data storage circuit with hybrid memory technologies requiring data transfer solutions between different memory arrays.

BACKGROUND

In the field of embedded computers, the execution of calculation algorithms involves a growing number of numerical variables. The electronic chips implementing those algorithms require a large memory capacity to store the calculation variables. These computational algorithms can implement several computational phases: a first phase with a high number of writing operations of said variables; and a second phase with a high number of reading operations of said variables.

Different types of non-volatile memories can be used to implement the means for storing the computational variables of a computer circuit. However, the different non-volatile memory technologies have different characteristics of reliability and robustness towards a considerable number of read or/and write operations. To qualify the robustness of different memory technologies, the following characteristics are defined:

- The "write endurance" means the maximum number of write cycles a memory cell can endure before structural failure. This is a criterion for characterizing the technological robustness of memory cells in the face of an intense number of write operations.
- The "read endurance" means the maximum number of read cycles experienced by a memory cell before its structural failure. This is a criterion for characterizing the technological robustness of memory cells in the face of an intense number of read operations.
- The "read energy" is the energy required to read one bit from the memory cell; it is expressed in Joules per bit. It is, therefore, a criterion for characterizing the energy performance of memory cells when performing a read operation.
- "Write energy" is the energy required to write a bit in the memory cell; it is expressed in Joules per bit. It is, therefore, a criterion for characterizing the energy performance of memory cells during the performance of a write operation.

The number of read and write operations to implement calculation algorithms is high, and increasing, and therefore it is a challenge to decrease the energy consumption and improve the lifespan of such electronics systems embedding non-volatile memories. It is even more important for systems dedicated to a mobile application (telephony, autonomous vehicle, robotics, etc.) which can be energy constrained and running for a long time. There is therefore a need for the development of computing circuits that can satisfy the constraints of embedded systems and the targeted applications, mainly in terms of energy consumption, lifespan, and also simplicity of data transfer.

In this context, a technical problem to be solved is the improvement of the energy performance and the technological robustness of the storage means for a computer circuit with two operating phases. Such computing circuit being able to execute: a first operating phase requiring a large number of write operations; and a second operating phase requiring a large number of read operations of said storage means.

Response to the Problem

In order to improve the energy performance and technological robustness of the storage means of a computer circuit, the invention provides a hybrid data storage circuit comprising a first memory array of FeRAM memory units and a second memory array of OxRAM memory units. The two technologies are suitable candidates to enable an on-chip computing circuit in the context of the technical problem. Indeed, FeRAM memory units have a high write endurance and a low write energy. This makes the FeRAM array more suitable for carrying out a phase requiring several iterations of writing the stored data rather several iterations of reading. OxRAM memory units have a high read endurance and a low read energy making it more suitable for performing a computational operation requiring a considerable number of reads of the stored data rather than making iterations of writing. Besides, the reading operation of a FeRAM memory unit is a destructive operation. Thus, the FeRAM technology is less suitable for carrying out a computational operation requiring a considerable number of reads of the stored data. The two memory arrays with different technologies are produced in the same chip. This enables a more efficient manufacturing process and a gain in the surface of the data storage circuit.

The invention provides further a data transfer stage co-integrated in the same semiconductor substrate with both arrays; and enabling the data transfer from one array to another when switching from said first phase (high number of write operations) to said second phase (high number of read operations).

The invention is described in the application context of an artificial neural network for illustrative purposes without loss of generality. The features of the invention remain valid for any computing circuit executing algorithms having two operating phases, such that the first configuration requires a large number of operations for writing data (or updating) and such that the second configuration requires a large number of operations for reading said data.

The implementation of artificial neural networks is divided into two phases: learning phase and inference phase. The learning phase consists in modifying the parameters such as the synaptic weights of the neural network according to a learning algorithm, to make them converge towards values enabling the network to accomplish the task to which it is trained with a sufficiently high accuracy. The inference phase consists in applying the previously learned task to the input data. Therefore, it is clear that the synaptic weights are modified several times during the learning phase, whereas they are read several times during the inference operation.

SUMMARY OF THE INVENTION

In accordance with a first aspect of the invention, there is provided a data storage circuit comprising:
- a first memory array comprising a plurality of FeRAM memory units;
- a second memory array comprising a plurality of OxRAM memory units;
- each of the first and second memory arrays comprising: a plurality of word lines, a plurality of source lines and a plurality of bit lines
- for each column each memory unit comprising:
  - a memory cell having a first electrode and a second electrode connected to the source line associated to said memory unit;
  - A selection transistor having a gate connected to the word line associated to said memory unit and placed in series with the memory cell between the source line and a bit line associated to of said memory unit
- said data storage circuit comprising further:
- a data transfer stage configured to transfer data from a set of source FeRAM memory units having a common bit line to a target OxRAM unit by converting a read signal from said common bit line to a transfer voltage applied on a target line of the target OxRAM unit said target line corresponding to the word line or the source line and having the same direction as said common bit line According to a development of the first aspect of the invention, the data storage circuit comprises further:
- a reading stage data for each one of the first memory array and the second memory array;
- a writing stage data for each one of the first memory array and the second memory array;
- a controlling unit configured to:
  - command the reading stage to read the content of the set of source FeRAM memory units
  - activate the data transfer stage and applying a SET operation on the target OxRAM unit According to a development of the first aspect of the invention, the first memory array, the second memory array and the data transfer stage are produced on a same chip.

According to a development of the first aspect of the invention, each of the source FeRAM memory units contains a binary data; the target OxRAM unit is programmable according to at least three conductance states. The data transfer stage is configured to convert the number of source FeRAM memory units containing a high logical state to a corresponding conductance state in the target OxRAM unit.

According to a development of the first aspect of the invention, the data transfer stage comprises a capacitive element between said common bit line and an electrical ground said capacitive element forming a capacitive voltage divider with the set of source FeRAM memory units.

According to a development of the first aspect of the invention, the data transfer stage comprises an isolating switch between said common bit line of the set of source FeRAM memory units and the word line of the target OxRAM unit.

According to a development of the first aspect of the invention, the data transfer stage comprises a reset switch between the word line of the target OxRAM unit and an electrical ground.

According to a development of the first aspect of the invention, the data transfer stage comprises a voltage follower circuit having:
- an input connected to the common bit line of the set of source FeRAM memory units;
- and an output connected to the word line or on the source line of the target OxRAM unit.

According to a development of the first aspect of the invention, the data storage circuit comprises further a cache memory to temporary store a copy of data provided from the set of source FeRAM memory units during the transfer.

According to a development of the first aspect of the invention, the cache memory is implemented with a subset of FeRAM memory units from the first memory array.

According to a development of the first aspect of the invention, the cache memory is implemented with a plurality of latch circuits.

According to a development of the first aspect of the invention, the data storage circuit comprises further a comparator configured to compare:
- the data stored in the target OxRAM unit after a transfer to the copy data stored in the cache memory.

In accordance with a second aspect of the invention, there is provided a computing circuit for executing a computational algorithm involving a numerical variable in at least two phases of operation;
- the first phase of operation requiring a higher number of writing operations of said numerical variable than the second phase of operation;
- the second phase of operation requiring a higher number of reading operations of said numerical variable than the second phase of operation;
- said computer circuit comprising a data storage circuit according the first aspect of the invention wherein the controlling unit is configured to:
  - command the reading and the writing stage to use the data stored in the first memory array during the first phase.
  - command the reading and the writing stage and the data transfer stage to perform a data transfer operation from the first memory array to the second memory array;
  - command the reading and the writing stage to use the data stored in the second memory array during the second phase.

According to a development of the second aspect of the invention, said computing circuit is configured to implement an artificial neural network, the neural network being composed of a succession of layers each consisting of a set of neurons, each layer being associated with a set of synaptic coefficients, wherein:
- the numerical variables are the synaptic coefficients of the neural network,
- the first phase of operation is a learning phase;
- the second phase of operation is an inference phase.

BRIEF DESCRIPTION OF THE DRAWINGS

The above and other advantages of the present invention will now be described with reference to the accompanying drawings, in which.

DETAILED DESCRIPTION

Figure 1A:
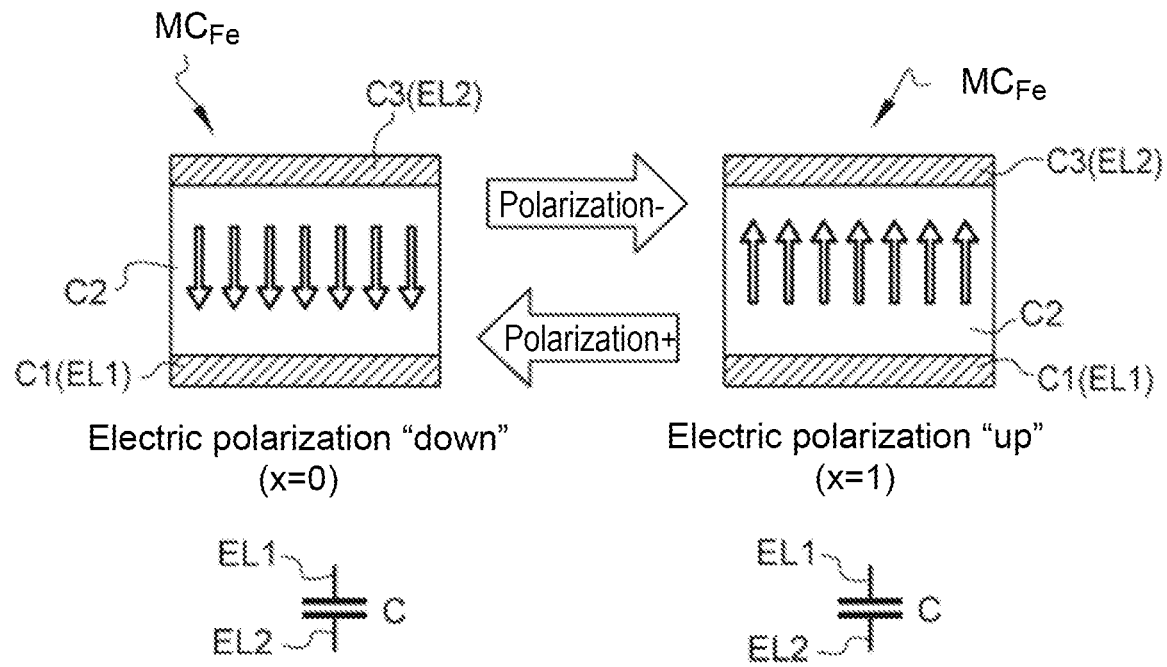
FIG. 1*a* shows a schematic diagram of a cross section of a FeRAM memory cell.

FIG. 1a shows a schematic diagram of a cross section of a FeRAM memory cell $MC_{Fe}$ used for the implementation of the invention. A FeRAM memory cell $MC_{Fe}$ consists of a stack of thin layers in the following order: a first layer C1 made of an electrically conductive material forming a lower electrode EL1; a second layer C2 made of a dielectric and ferroelectric material and a third layer C3 made of an electrically conductive material forming an upper electrode EL2. The second layer C2 is referred to in the following as the "FeRAM core layer".

The stack of thin layers forms a MIM-type structure (acronym Metal-Insulator-Metal) that operates as a capacitive element C. The ferroelectric nature of the core layer C2 induces the following behavior: When a positive voltage is applied to the upper electrode EL2, the polarisation of the electric dipoles of the core layer is directed in a "negative" direction. On the opposite, when a positive voltage is applied to the lower electrode EL2, the polarization of the electric dipoles is directed in a "positive" direction. The direction of the electrical polarization in the core layer C2 is unchanged even if the power is shut off. Thus, the following convention is adopted as illustration: when a FeRAM memory cell $MC_{Fe}$ is configured to store binary data in the low logic state (x=0), a positive write voltage is temporarily applied to the upper electrode EL2 to obtain a bias directed downwards in the core layer C2. Conversely, when a FeRAM memory cell $MC_{Fe}$ is configured to store binary data in the high logic state (x=1), a positive write voltage is temporarily applied to the lower electrode EL1 to obtain a bias directed upwards in the core layer C2.

The reading operation of a FeRAM memory cell $MC_{Fe}$ is a destructive operation. Indeed, during a read operation, the memory cell $MC_{Fe}$ receives an electric read voltage on the upper electrode EL2 so as to overwrite it to a low logic state (x=0, down). The dynamics of the transition following the application of the read voltage are then observed. If the electrical dipoles in the core layer are previously polarised with a "positive" orientation (x=1, up), a relatively large amount of electrical charge will be emitted by the device during the transition. Conversely, if the electrical dipoles of the core layer are pre-polarized with a "negative" orientation (x=0, down), the amount of charge delivered during the transition is lower. As a result, the readout procedure estimates the amount of charge emitted when biased to a low logic state (x=0) and therefore erases the logic value of the stored data. Thus, the reading operation of the FeRAM memory cell $MC_{Fe}$ is destructive.

Figure 1B:
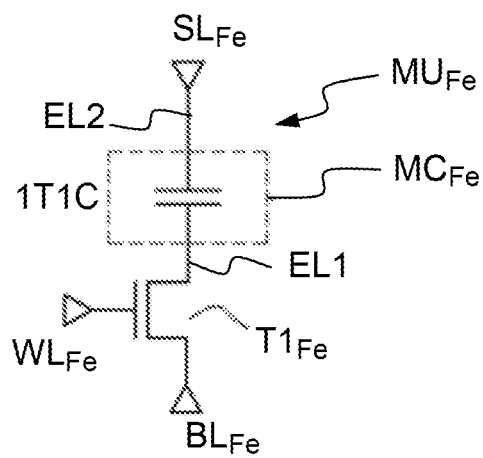
FIG. 1*b* shows a circuit diagram of a FeRAM memory unit according to an embodiment of the invention.

FIG. 1b shows a circuit diagram of a FeRAM memory unit $MU_{Fe,ij}$ according to an embodiment of the invention. In the context of the invention, a plurality of FeRAM memory units $MU_{Fe,ij}$ are integrated together forming a first memory array having N columns and M lines. Each memory unit $MU_{Fe,ij}$ comprises a memory cell $MC_{Fe}$ as described previously, and a selection transistor $T1_{Fe}$. The second electrode EL2 of said memory cell $MC_{Fe}$ is connected to a source line $SL_{j,Fe}$. The selection transistor $T1_{Fe}$ has a gate connected to a word line $WL_{i,Fe}$. The selection transistor $T1_{Fe}$ connects the first electrode EL1 to a bit line $BL_{j,Fe}$.

Figure 2A:
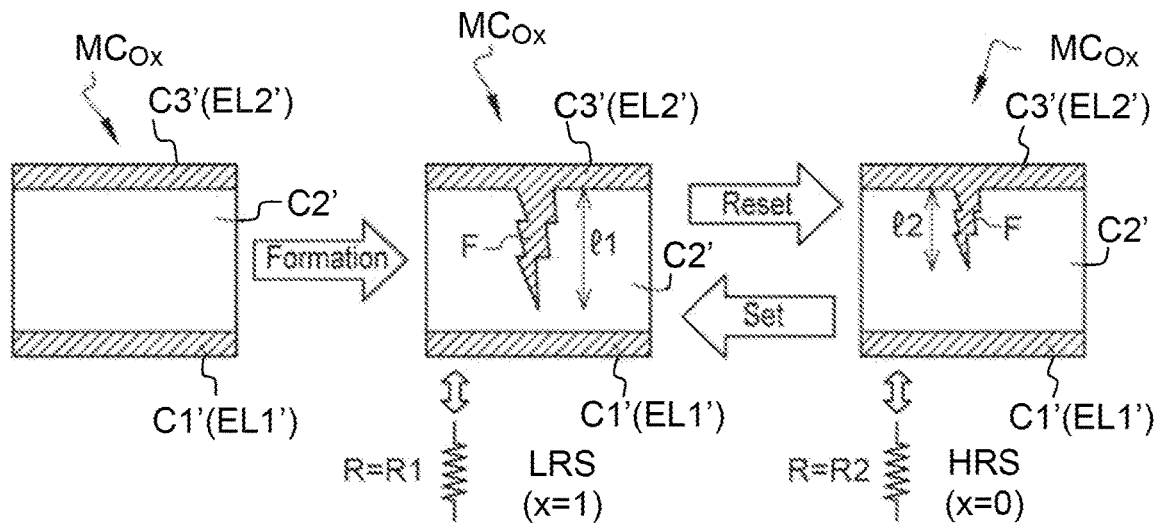
FIG. 2*a* shows a schematic diagram of a cross section of an OxRAM memory cell.

FIG. 2a shows a schematic diagram of a cross section of an OxRAM memory cell $MC_{Ox}$ used in the circuit according to the invention. An OxRAM memory cell $MC_{Ox}$ consists of a stack of thin layers in the following order: a first layer C1' made of an electrically conductive material forming a lower electrode EL1'; a second layer C2' made of a dielectric material and a third layer C3' made of an electrically conductive material forming an upper electrode EL2'. The second layer C2' is referred to in the following as the "OxRAM core layer".

Initially, the OxRAM memory cell is a MIM (metal, insulator, metal) type structure having a quasi-infinite resistance between the two electrodes EL1' and EL2'. In order to obtain an OXRAM memory cell, it is necessary to grow the filament F starting from the top electrode EL2' through at least part of the volume of the OxRAM core layer C2'. To form the filament, a forming voltage is applied to the top electrode EL2'. The growth of the filament allows obtaining a variable resistance. The variation of the resistance value is realized by modulating the length l of the conductive filament F.

Figure 2B:
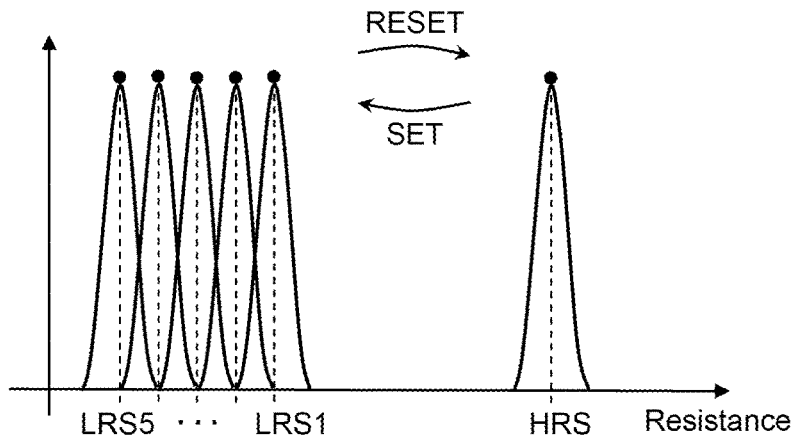
FIG. 2*b* shows a circuit diagram of a OxRAM memory unit according to an embodiment of the invention.

Once the conductive filament F is formed, the behavior of a resistive element is obtained with a variable resistance R according to the length l of the conductive filament F. When a positive electrical voltage is applied to the lower electrode EL1', a reduction of the length of the conductive filament is obtained. Thus, the resistance of the OxRAM memory cell $MC_{Ox}$ increases. This is referred to as a high resistive state and a RESET type of writing operation. This is equivalent to a low logic state (x=0). Conversely, when a positive electrical voltage is applied to the top electrode EL2', the length of the conductive filament F increases. Thus, the resistance of the OxRAM memory cell $MC_{Ox}$ decreases. This is referred to as a low resistive state and a SET-type writing operation. Multiple resistance states are possible in one OxRAM cell as illustrated in the example of FIG. 2b. In this example, there is one HRS state corresponding to x=0 and five LR states (Low Resistance State) depending on the length of the filament F. Thus, it is possible to program a multilevel OxRAM cell with five possible values.

Reading an OxRAM memory cell is equivalent to estimate the resistance between the upper electrode and the lower electrode and compare it to multiple threshold values to determine whether the resistive state from HRS or LRS1 to LRSS.

Figure 2C:
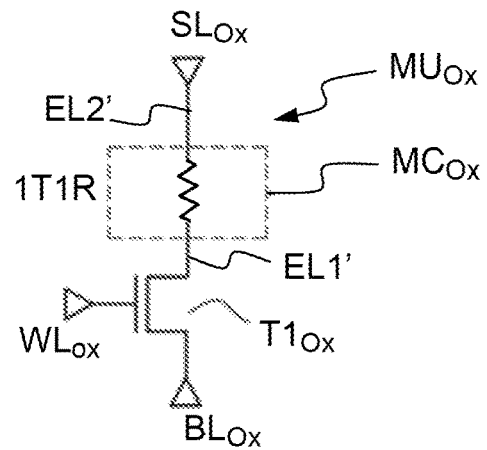
FIG. 2*c* shows a diagram of the multiple conductance states of an OxRAM memory unit according to an embodiment of the invention.

FIG. 2c shows a circuit diagram of a OxRAM memory unit $MU_{Ox,ij}$ according to an embodiment of the invention. In the context of the invention, a plurality of OxRAM memory unit $MU_{Ox,ij}$ are integrated together forming a second memory array having N' columns and M' lines. Each memory unit $MU_{Ox,ij}$ comprises a memory cell $MC_{Ox}$ as described previously, and a selection transistor $T1_{Ox}$. The second electrode EL2' of said memory cell $MC_{Ox}$ is connected to a source line $SL_{j,Ox}$. The selection transistor $T1_{Ox}$ has a gate connected to a word line $WL_{i,Ox}$. The selection transistor $T1_{Ox}$ connects the first electrode EL1 to a bit line $BL_{j,Ox}$.

Figure 3:
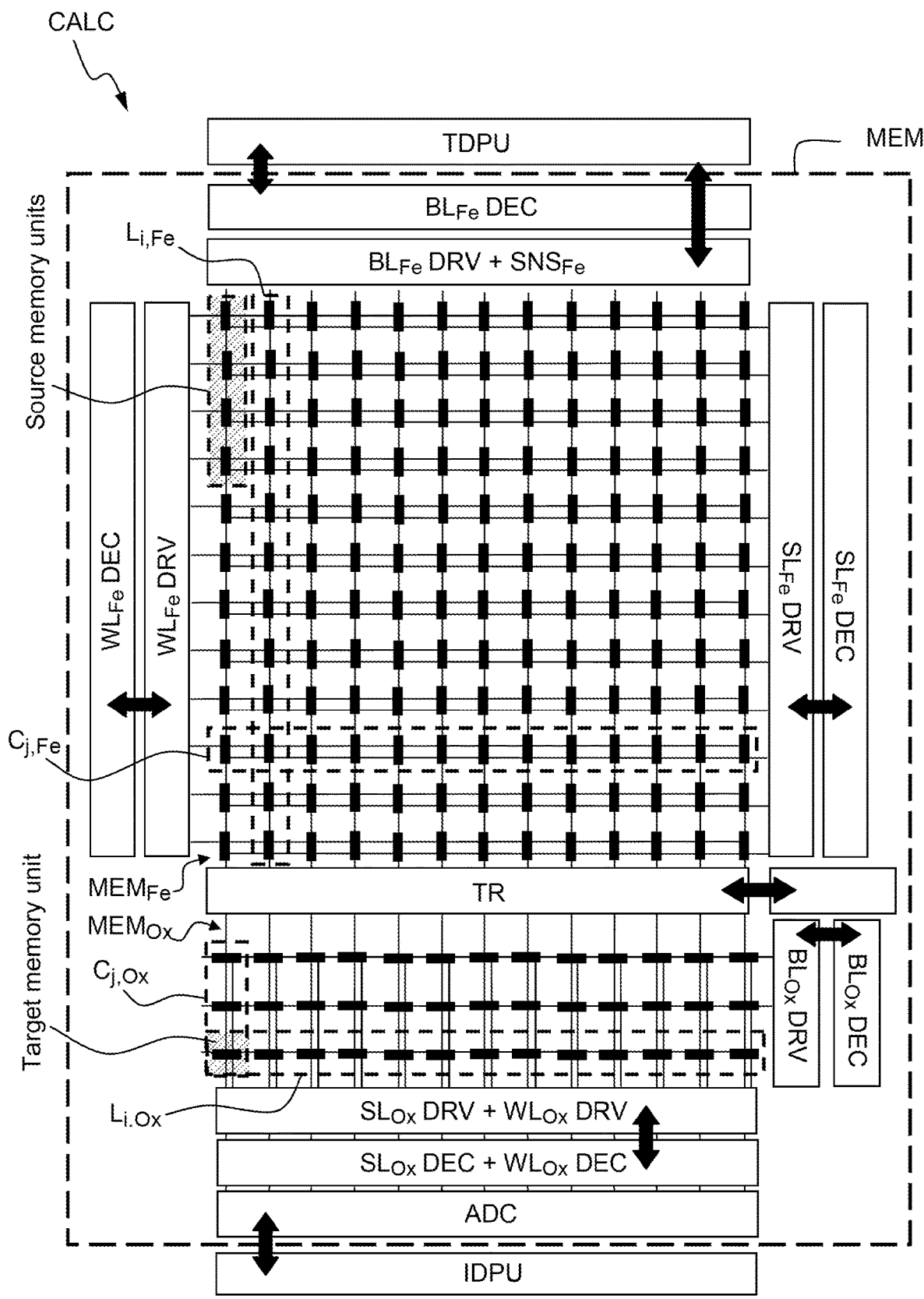
FIG. 3 shows a schematic diagram of the computing circuit according to an embodiment of the invention.

FIG. 3 shows a schematic diagram of the computing circuit CALC according to an embodiment of the invention. The computing circuit CALC comprises a data storage circuit MEM comprising: a first memory array $MEM_{FE}$, a second memory array $MEM_{OX}$; a data transfer stage TR implemented between the two arrays $MEM_{FE}$ and $MEM_{Ox}$ a reading stage of data for each one of said memory arrays; a writing stage of data for each one of said memory arrays and control stages.

The computing circuit CALC comprises further two processing units TDPU and IDPU. The first processing unit TDPU is configured to execute the calculations of the first configuration requiring a large number writing data operations (or updating). In the context of a neural network the first configuration corresponds to a training phase. The second processing unit IDPU is configured to execute the calculations of the second configuration requiring a large number of reading data operations. In the context of a neural network the second configuration is an inference phase. In the context of a neural network TDPU stands for "Training Digital Processing Unit" and IDPU stands for "Inference Digital Processing Unit".

The two memory arrays and the data transfer stage TR are produced on the same semiconductor substrate in the case of a 2D chip. Alternatively, the two memory arrays and the data transfer stage TR are assembled together to form one 3D chip.

As mentioned above, the FeRAM units $MU_{Fe,ij}$ are used for the learning phase of the hardware implementation of a neural network. The very large writing endurance allows modifying the stored synaptic weights throughout the training phase very frequently, as required by most learning algorithms. On the other hand, the quasi-infinite reading endurance of OxRAM units $MU_{Ox,ij}$ and their multi-level capability allows creating inference engines with high reliability. Advantageously, the matrix-vector multiplication, the dominant operation during the implementation of Neural Network inference, can be performed inside the OxRAM memory itself $MU_{Ox,ij}$ by means of the Kirchhoff current summation laws. In the case of an In-Memory computing, the first and second processing units TDPU and IDPU are part of the data storage circuit MEM.

The data transfer stage TR is activated during the transition from the first configuration (training) to the second configuration (inference). The data transfer stage TR allows the transfer of the data (synaptic weights for example) stored in a set of source memory units $MU_{Fe,ij}$ of a first memory array $MEM_{FE}$ to a target OxRAM unit $MU_{ox,ij}$ of the second memory array $MEM_{Ox}$.

As a non-limiting illustrative example, the first memory array $MEM_{FE}$ comprises for each row $L_{i,Fe}$ a word line $WL_{j,Fe}$ and a source line $SL_{j,Fe}$ both common to the memory units belonging to the said line. The first memory array $MEM_{FE}$ comprises further for each column $C_{j,Fe}$ a bit line $BL_{j,Fe}$ common to the memory units belonging to the said column. Similarly, the second memory array $MEM_{OX}$ comprises for each row $L_{i,Ox}$ a word line $WL_{i,Ox}$ and a source line $SL_{j,Ox}$ both common to the memory units belonging to the said line. The second memory array $MEM_{Ox}$ comprises further for each column $C_{j,Ox}$ a bit line $BL_{j,Ox}$ common to the memory units belonging to the said column. Each memory array has its corresponding circuits of reading and writing. From a physical implementation point of view (circuit floorplan), the colums $C_{j,Ox}$ extends along an orthogonal direction compared to the columns $C_{j,Fe}$.

More generally, the bit lines $BL_{j,Fe}$ of the first memory array $MEM_{FE}$ are oriented according to the same direction as the word lines $WL_{i,Ox}$ of the second memory array $MEM_{OX}$. This corresponds to the embodiment where the word lines $WL_{i,Ox}$ of the second memory array $MEM_{OX}$ are the target lines during a transfer according to the invention.

Alternatively, the bit lines $BL_{j,Fe}$ of the first memory array $MEM_{FE}$ are oriented according to the same direction as the word lines $SL_{i,Ox}$ of the second memory array $MEM_{OX}$. This corresponds to the embodiment where the source lines $SL_{i,Ox}$ of the second memory array $MEM_{OX}$ are the target lines during a transfer according to the invention.

The reading and writing stages of the first memory array $MEM_{FE}$ comprise a first driving circuit $WL_{Fe}$_DRV for driving the word lines $WL_{i,Fe}$ of said array, a second driving circuit $SL_{Fe}$_DRV for driving the source lines $SL_{i,Fe}$ of said array and a third driving circuit $BL_{Fe}$_DRV for driving the bit lines $BL_{i,Fe}$ of said array. Similarly, the reading and writing stages of the second memory array $MEM_{Ox}$ comprise a fourth driving circuit $WL_{Ox}$_DRV for driving the word lines $WL_{i,Ox}$ of said array, a fifth driving circuit $SL_{Ox}$_DRV for driving the source lines $SL_{i,Ox}$ of said array and a sixth driving circuit $BL_{Ox}$_DRV for driving the bit lines $BL_{i,Ox}$ of said array. Each driving circuit is commanded by a dedicated decoder as illustrated in FIG. 3: the first driving circuit $WL_{Fe}$_DRV is controlled by a first decoder $WL_{Fe}$_DEC, the second driving circuit $SL_{Fe}$_DRV is controlled by a second decoder $SL_{Fe}$_DEC and so on.

Thus, the control stages comprise the six decoders $WL_{Fe}$_DEC, $SL_{Fe}$_DEC, $BL_{Fe}$_DEC, $WL_{Ox}$_DEC, $SL_{Ox}$_DEC, $BL_{Ox}$_DEC and a controlling unit CTRL managing the activation of the data transfer stage TR.

The data storage circuit MEM comprises further a sensing circuit $SNS_{Fe}$ for each bit lines $BL_{i,Fe}$, containing adequate circuitry to read the content of each FeRAM unit $MU_{Fe,ij}$ connected to said bit lines $BL_{i,Fe}$. Adding to that, the data storage circuit MEM comprises an Analog to Digital Converter ADC to convert the analog read output signals provided by the OxRAM memory units $MU_{Ox,ij}$ into digital output signals propagated for the rest of the computing circuit.

During the learning phase, the FeRAM memory units $MU_{Fe,ij}$ are addressed by means of their $WL_{i,Fe}$, $BL_{j,Fe}$ and $SL_{j,Fe}$ nodes. It is possible to use FeRAM memory units $MU_{Fe,ij}$ that are identical and operating under the same conditions in terms of applied read/write pulses. Thus, the different memory units of the first array have an equivalent significance. In this embodiment we use a thermometric code of multiple logical values (1 and 0) to encode a weight value X on a set of K memory units $MU_{Fe,ij}$. In particular, if K FeRAM memory units $MU_{Fe,ij}$ are sharing a common bit line $BL_{j,Fe}$, K+1 accessible states can be encoded with the set of said K FeRAM memory units $MU_{Fe,ij}$. For example, fora set of 4 FeRAM memory units $MU_{Fe,ij}$ (as illustrated in FIG. 3), if all the FeRAM memory units $MU_{Fe,ij}$ are in a low logical state (x=0), the data X encoded in the set of the FeRAM memory units is equal to 0. If one FeRAM memory units $MU_{Fe,ij}$ is in a high logical state (x=1) and the rest are in a low logical state, than X=1. If two FeRAM memory units $MU_{Fe,ij}$ are in a high logical state (x=1) and the rest are in a low logical state, than X=2 and so on.

After describing the general architecture of the data storage circuit MEM according to the invention, we will focus on the different embodiments solving the data transfer problem. We remind that the invention allows data transferring from the FeRAM memory array to the OxRAM memory array without propagating the data to external circuits. We mean by external circuits, all the circuits which are not produced in the same chip. Besides, the invention allows data transferring from the FeRAM memory array to the OxRAM memory array without passing through digital to analog converters. When programming an OxRAM device in a multi-level mode, the gate voltage is tuned according to which conductance value the device has to be programmed. In this case this analog voltage is directly provided by reading the plurality of devices.

Figure 4A:
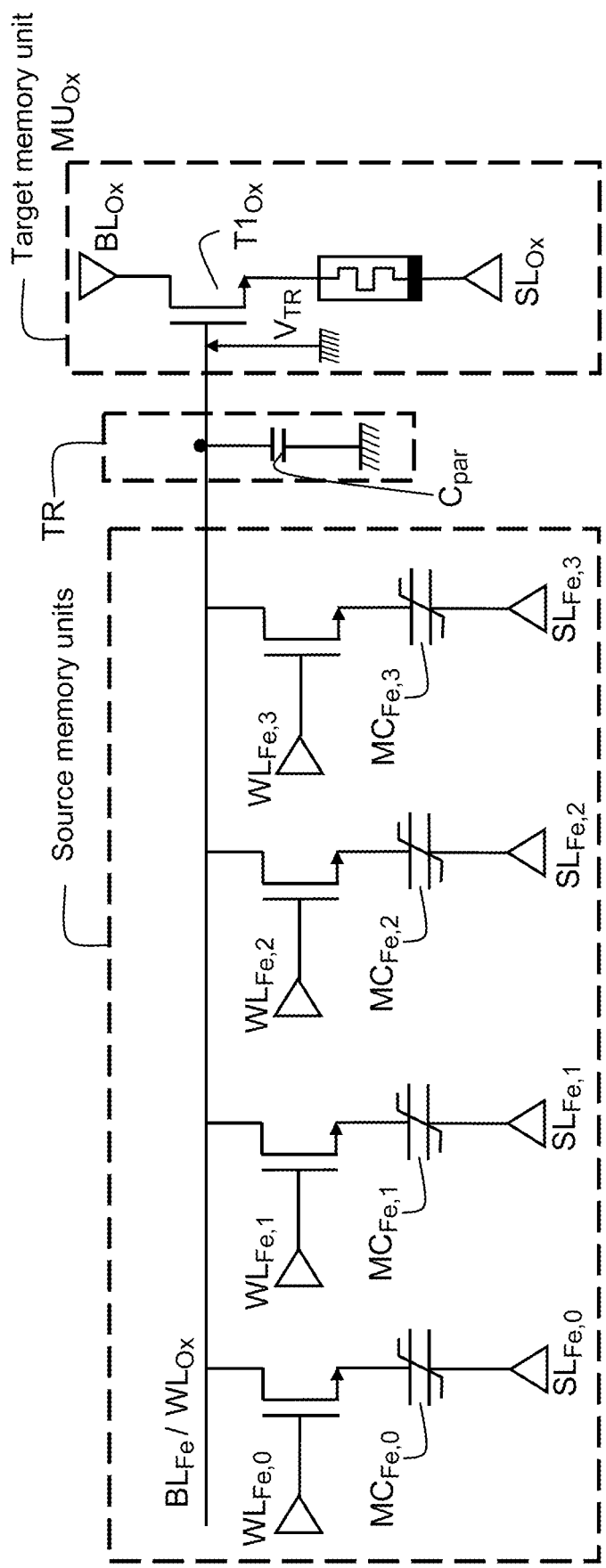
FIG. 4a shows a circuit diagram of the data transfer stage according to a first embodiment of the invention.

FIG. 4a shows the circuit diagram of the data transfer stage according to a first embodiment of the invention. For the sake of simplicity, we describe the transfer from a set of four source FeRAM memory units $MU_{Fe,0}$ to $MU_{Fe,3}$ to one multilevel OxRAM memory units $MU_{Ox}$. It will be noticed that the source FeRAM memory units $MU_{Fe,ij}$ have a common bit line referred to here as $BL_{Fe}$.

In a first embodiment, the data transfer stage TR is realized by a direct physical electrical connection between the common bit line $BL_{Fe}$ and the word line $WL_{Ox}$ controlling the gate of the selection transistor $T1_{Ox}$ of the target memory cell. The common bit line $BL_{Fe}$ creates a parasitic capacitance $C_{par}$ with respect to the global electrical ground of the computing circuit. The direct physical connection between $BL_{Fe}$ and $WL_{Ox}$ induces the connection of the parasitic capacitance $C_{par}$ to the gate of the selection transistor $T1_{Ox}$. Accordingly, a capacitive voltage divider is formed by the capacitive memory cells $MC_{Fe,0}$ to $MC_{Fe,4}$ and the parasitic capacitance $C_{par}$. This structure implements a digital to analog conversion of the stored data in the capacitive memory cells $MC_{Fe,0}$ to $MC_{Fe,4}$, without the need of a Digital Analog Converter (DAC). In fact, when reading the capacitive memory cells $MC_{Fe,0}$ to $MC_{Fe,4}$, the second driving circuit $SL_{Fe}$_DRV is configured to apply a positive pulse on the different source lines $SL_{Fe,0}$ to $SL_{Fe,3}$. This induces a charge transfer such as the parasitic capacitance $C_{par}$ is charged proportionally to the sum of the stored charges in the capacitive memory cells $MC_{Fe,0}$ to $MC_{Fe,4}$. That means that the voltage across the parasitic capacitance $C_{par}$ is proportional to the number of high logical state (x=1) encoded in the set of the FeRAM memory units $MU_{Fe,0}$ to $MU_{Fe,3}$. Accordingly, the gate voltage of the selection transistor $T1_{Ox}$ is proportional to the value of the digital data read in the source memory units. We obtain a modulation of the conductance of the selection transistor $T1_{Ox}$ of the target memory unit $MU_{Ox}$ depending on the digital data stored in the source FeRAM memory units.

$$V_{BL,Fe} = V_{TR} = \frac{K.C_D}{K.C_D + C_{PAR}} + \frac{2.Pr.S}{K.C_D + C_{PAR}} SW$$

with $V_{BL,Fe}$ the voltage on the common bit line $BL_{Fe}$; $V_{TR}$ the transfer voltage applied on the gate of the selection transistor of the target OxRAM memory unit; K=4 the number of source FeRAM memory units; $C_D$ the capacitance of each capacitive memory cells $MC_{Fe,0}$ to $MC_{Fe,4}$; Pr and S respectively the remanent polarization and the surface of each ferroelectric capacitor $MC_{Fe,0}$ to $MC_{Fe,4}$; and SW the number of ferroelectric memory cells string a high logical state (x=1).

Finally, the fifth driving circuit $SL_{Ox}$_DRV is configured to apply a writing positive pulse on the source line $SL_{Ox}$ of the target memory cell and the sixth driving circuit $BL_{Ox}$_DRV to connect the bit line $BL_{Ox}$ to the ground. The flowing current through the resistive target memory cell $MU_{Ox}$ is proportional to the conductance of the selection transistor $T1_{Ox}$ commanded by the common bit line $BL_{Fe}$ of the source FeRAM memory units $MU_{Fe,0}$ to $MU_{Fe,3}$. Accordingly, the length of the filament in the resistive target memory cell $MU_{Ox}$ is proportional to charges stored in the source FeRAM memory units. The introduced change in the gate voltage results in a different compliance for the current flowing into the OxRAM devices, ultimately allowing tuning its conductance. We underline that a filament growing step and a RESET initialization are mandatory before the transfer process described above.

We have described this way a solution enabling a data transfer from the first array $MEM_{FE}$ to the second array $MEM_{Ox}$ integrated in the same chip and produced on the same substrate. The direct connection between the source FeRAM memory units and the target OxRAM memory unit can be realized by conductive thin layers and vias manufactured by usual deposition techniques for microelectronics. This means a considerable gain in the circuit surface and in the speed of data transfer without adding complexity to said circuit.

Figure 4B:
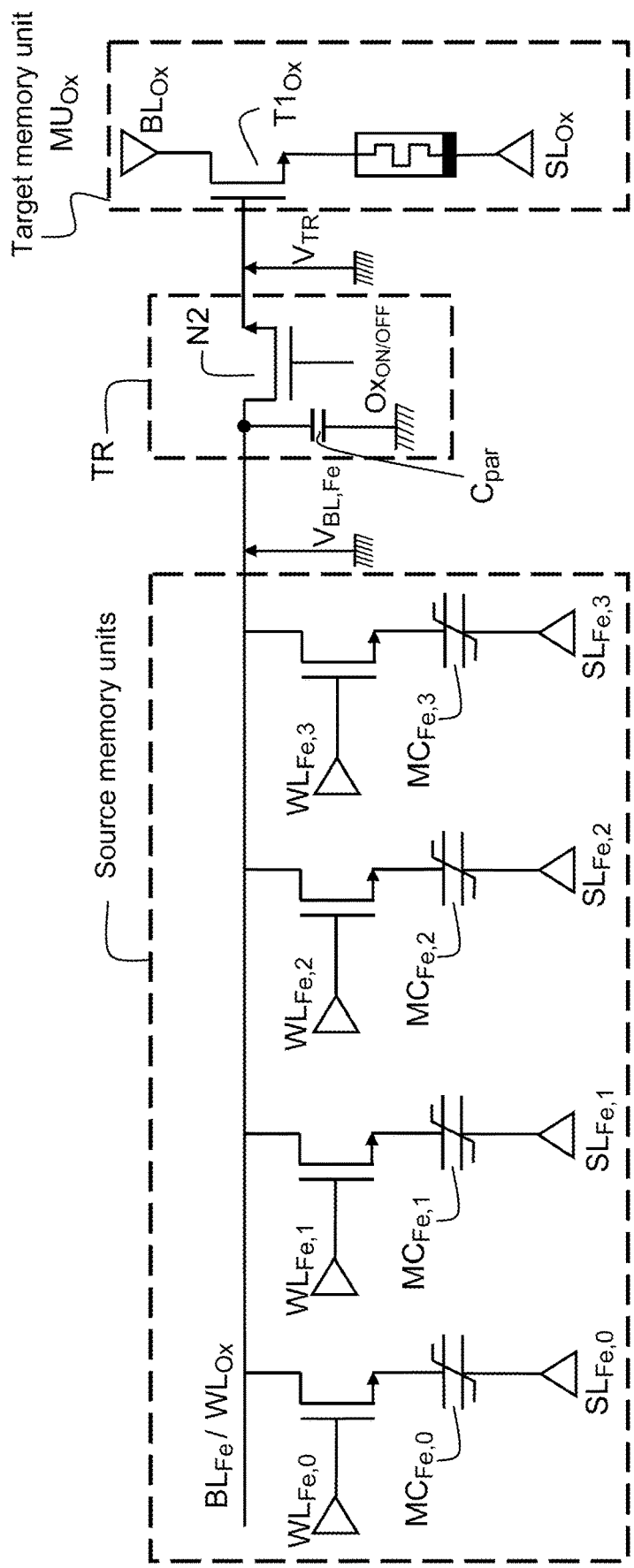
FIG. 4b shows a circuit diagram of the data transfer stage according to a second embodiment of the invention.

FIG. 4b shows a circuit diagram of the data transfer stage TR according to a second embodiment of the invention. In this embodiment the data transfer stage TR comprises further an isolating switch N2 between the common bit line $BL_{Fe}$ of the set of source FeRAM memory units ($MUF_{e,0}$ to $MUF_{e,4}$) and the word line $WL_{Ox}$ of the target OxRAM unit $MU_{Ox}$. Such a modification would reduce the line capacitor seen by the FeRAM array during the pure FeRAM operations. As a result, all operations on FeRAM would consume less. Furthermore, the reading of high logical states (x=1) is more accurate by reducing the capacitance seen by the first array $MEM_{FE}$. For example, the isolating switch N2 is realized by a transistor N2 controlled by a control signal $Ox_{On/Off}$ provided by control stage. When a transfer phase is initiated, the isolating switch N2 is in a conducting state to establish the connection with the gate of the selection transistor $T1_{Ox}$.

Figure 4C:
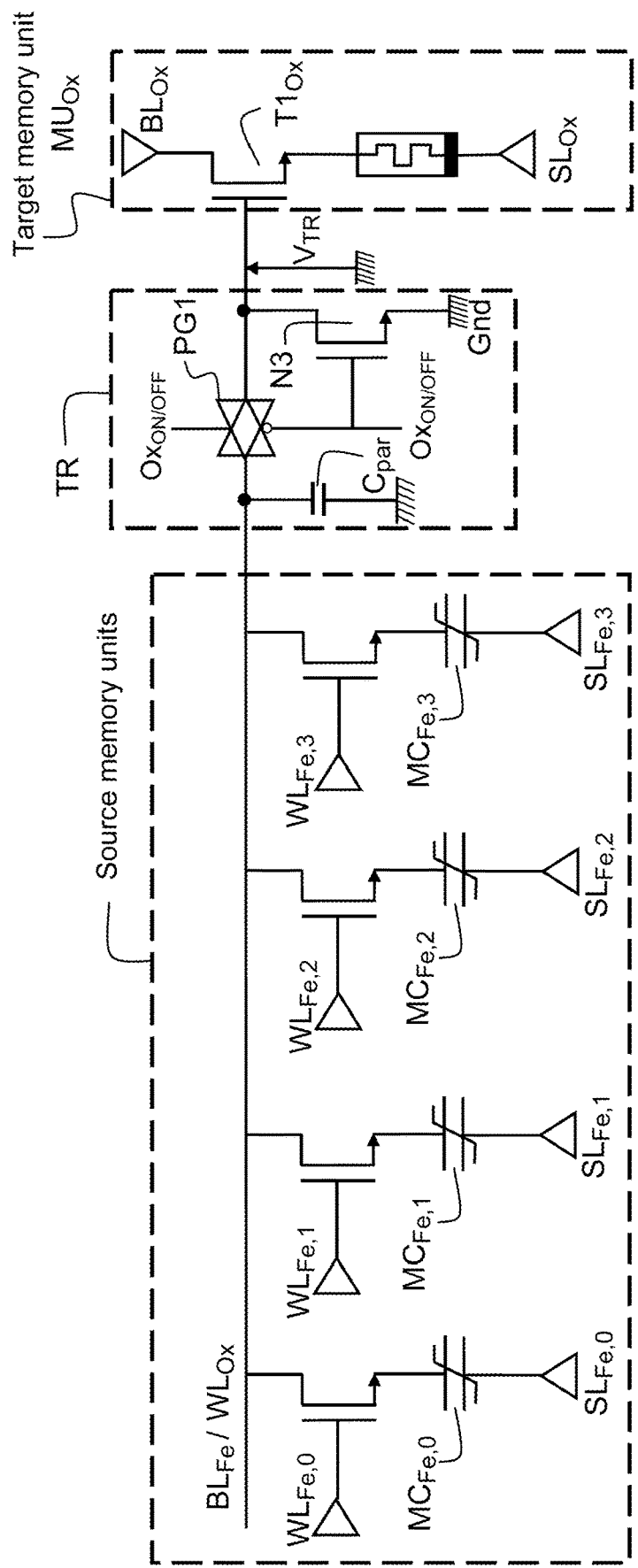
FIG. 4c shows a circuit diagram of the data transfer stage according to a third embodiment of the invention.

FIG. 4c shows a circuit diagram of the data transfer stage TR according to a third embodiment of the invention. In this embodiment, the isolating switch is a pass gate PG1 between the common bit line $BL_{Fe}$ of the set of source FeRAM memory units ($MU_{Fe,0}$ to $MU_{Fe,4}$) and the word line $WL_{Ox}$ of the target OxRAM unit $MU_{Ox}$. The data transfer stage TR comprises further a reset switch, herein a transistor N3 between the gate of the selection transistor $T1_{Ox}$ and the electrical ground. The activation of the reset switch allows shutting off the selection transistor $T1_{Ox}$ when the OxRAM mode (inference) is off.

Figure 4D:
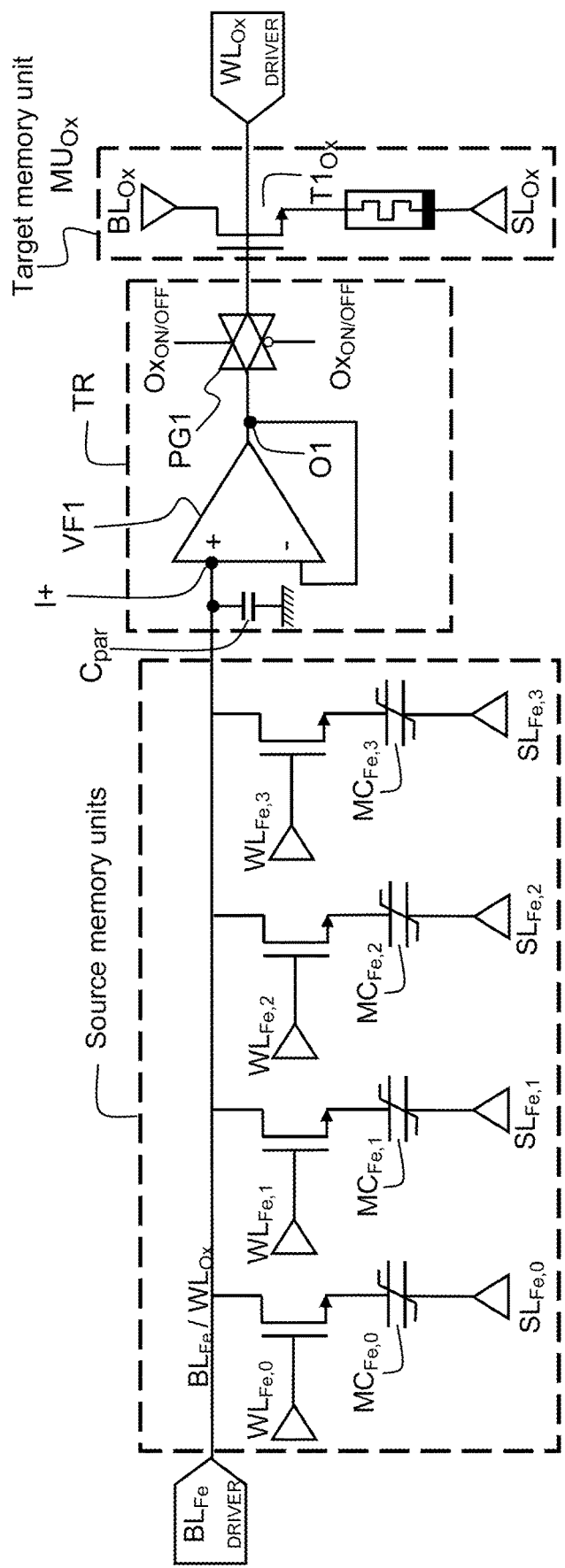
FIG. 4d shows a circuit diagram of the data transfer stage according to a fourth embodiment of the invention.

FIG. 4d shows a circuit diagram of the data transfer stage TR according to a fourth embodiment of the invention. In this embodiment, the data transfer stage TR comprises further a voltage follower VF1 having an input I+ connected to the common bit line $BL_{Fe}$ and an output O1 connected to the gate of the selection transistor $T1_{Ox}$ through the isolating switch PG1. With this embodiment, it is possible to keep the reading voltage on common bit line $BL_{Fe}$ while resetting the OxRAM (initialization step) before the transfer operation. The voltage follower VF1 is used to maintain voltage across the parasitic capacitance $C_{par}$ to the world line $WL_{Ox}$ of the target memory unit $MU_{Ox}$ without discharging said parasitic capacitance Opal. Thus, the read data from the FeRAM memory units can be stored in an analog form in the parasitic capacitance Opal even during the transfer.

The intermediate storage of the data in the parasitic capacitance $C_{par}$ is useful to solve the problem of the destructive reading process of the FeRAM in combination with the variability of the resulting conductance when programming a multilevel OxRAM memory unit as detailed below.

It has to be noticed that once the FeRAM units $MC_{Fe,0}$ to $MC_{Fe,4}$ are read simultaneously, the information stored in each one of the capacitors individually is lost, because of the destructive reading procedure. Ideally, information could be retrieved from the programmed conductance value into the target OxRAM unit $MU_{Ox}$. Nevertheless, state of the art OxRAM devices require an iterative programming procedure in order to tune the conductance within a certain window, because of process variability, as well as the inherent stochasticity of such devices. Therefore, a single-shot programming of the target OxRAM unit $MU_{Ox}$, obtained by means of the transfer procedure described above could result in a not correct value of programmed conductance. In order to overcome this issue, it is possible to use the voltage across the parasitic capacitance $C_{par}$ as an image of the lost data from the FeRAM units $MU_{Fe,0}$ to $MUF_{e,4}$ as this voltage is not impacted by the transfer operation thanks to the voltage follower VF1. The voltage follower VF1 enables to deliver low current adapted with the impedance of the gate of the selection transistors $T1_{Ox}$. This allows a better control of the voltage of the common bit line $BL_{Fe}$.

Figure 5:
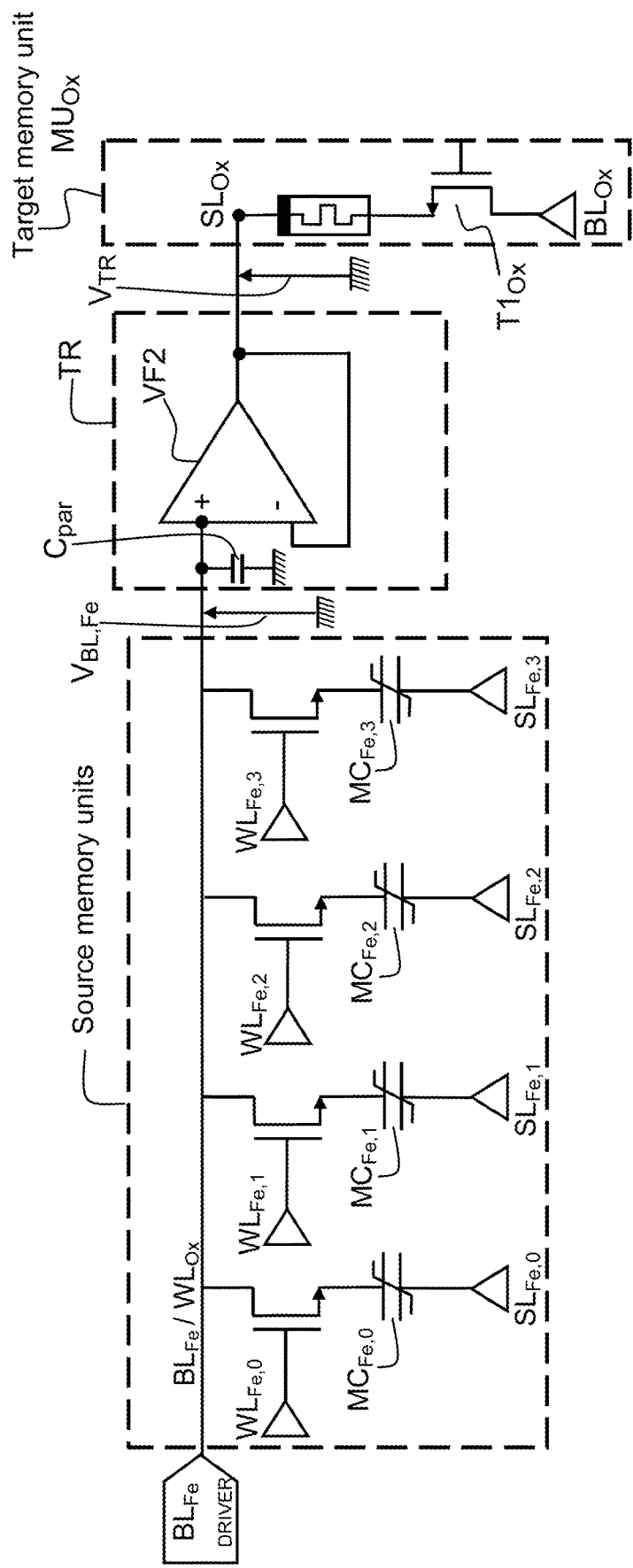
FIG. 5 shows a circuit diagram of the data transfer stage according to a fifth embodiment of the invention.

FIG. 5 shows a circuit diagram of the data transfer stage according to a fifth embodiment of the invention. In this embodiment, the data transfer stage TR is configured to transfer data from a set of source FeRAM memory units $MU_{Fe,0}$ to $MU_{Fe,4}$ to the target OxRAM unit $MU_{Ox}$ by converting a read signal $V_{BL,Fe}$ to a transfer voltage $V_{TR}$ applied on the source line $SL_{Ox}$ of the target OxRAM unit $MU_{Ox}$. The data transfer stage TR comprises a voltage follower VF2 having an input I+ connected to the common bit line $BL_{Fe}$ and an output O1 connected to the source line $SL_{Ox}$ of the target OxRAM unit $MU_{Ox}$. Thus, the read voltage $VBL_{Fe}$ across the parasitic capacitance is reproduced by the voltage follower VF2 on the source line $SL_{Ox}$. Contrary to the $WL_{Ox}$ node, the $SL_{Ox}$ node needs to provide the writing current to the target OxRAM unit $MU_{ox}$. To enable the setting of the OxRAM (filament length modification), the voltage follower VF2 should provide enough current intensity to provide the required energy for the setting operation. For example, the voltage follower VF2 is able to provide a current between 125 µA and 250 µA.

As explained above, the combination of the destructive reading process of the FeRAM cells with the random uncertainty of the writing process of multilevel OxRAM-cells represents a challenge concerning the mixed storage means reliability. We will describe in the following, several embodiments of the invention dealing with this problem.

Figure 6:
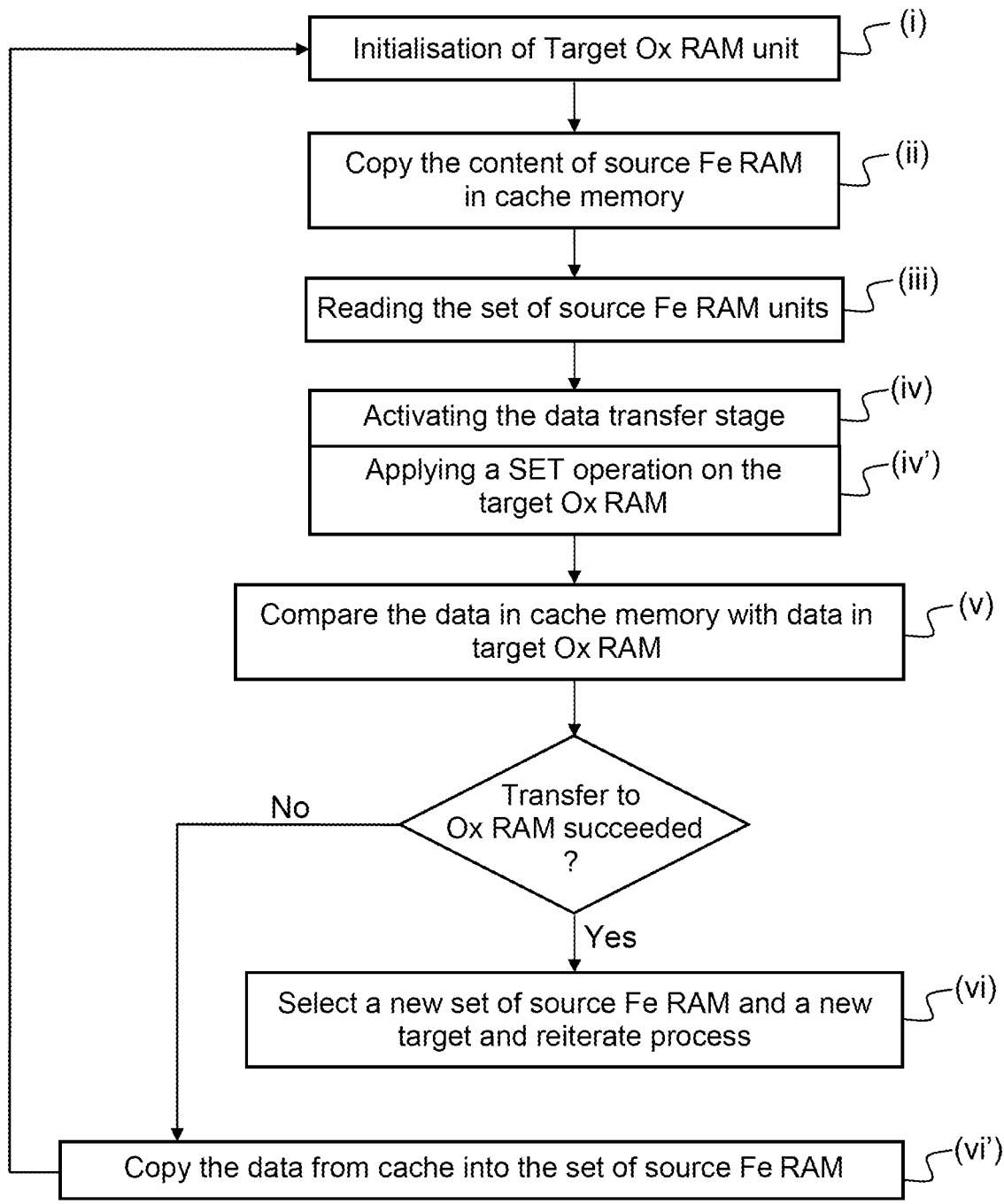
FIG. 6 shows a diagram illustrating the verification process of the data transfer according to any embodiment of the invention.

FIG. 6 shows a diagram illustrating the verification process of the data transfer according to any embodiment of the invention designed. The data storage circuit MEM comprises further a cache memory further a cache memory CM to temporary store a copy of data provided from the set of source FeRAM memory units $MU_{Fe}$ during the transfer. The cache memory CM can be a sub-set of FeRAM memory units from the first array $MEM_{FE}$. Alternatively, the cache memory CM can be a plurality of external latches or latches from the sensing circuit $SNS_{Fe}$. Alternatively, the cache memory CM can be the parasitic capacitance $C_{par}$ separated from the target OxRAM unit by a voltage follower as explained previously.

The first step (i) consists of an initialization of the target OxRAM unit by applying a RESET voltage to obtain a HRS state. The second step (ii) consists in copying the content of the data stored from the source FeRAM memory units $MU_{Fe}$ to the cache memory. The copying operation can be realized in a sub-set of the first array $MEM_{Fe}$ by dedicated means.

The third step (iii) consists in reading the set of the source FeRAM memory units $MU_{Fe}$. In the case of using the parasitic capacitance $C_{par}$ as cache memory CM, the copy step (ii) and the reading step (iii) are executed simultaneously.

The fourth step consists in activating the data transfer stage TR (iv) and simultaneously applying a SET operation (iv') on the target OXRAM memory unit in order transfer data from a set of source FeRAM memory units $MU_{Fe,ij}$ having a common bit line to the target OxRAM unit. The bit lines and the source lines of the OxRAM memory units sharing the same word line with the target OxRAM memory are grounded. As described previously, this operation is realized by converting the read signal $VBL_{Fe}$ from said bit line $BL_{Fe}$ to a transfer voltage VTR applied on the word line $WL_{Ox}$ or on the source line $SL_{Ox}$ of the target OxRAM unit $MU_{ox}$.

Figure 7A:
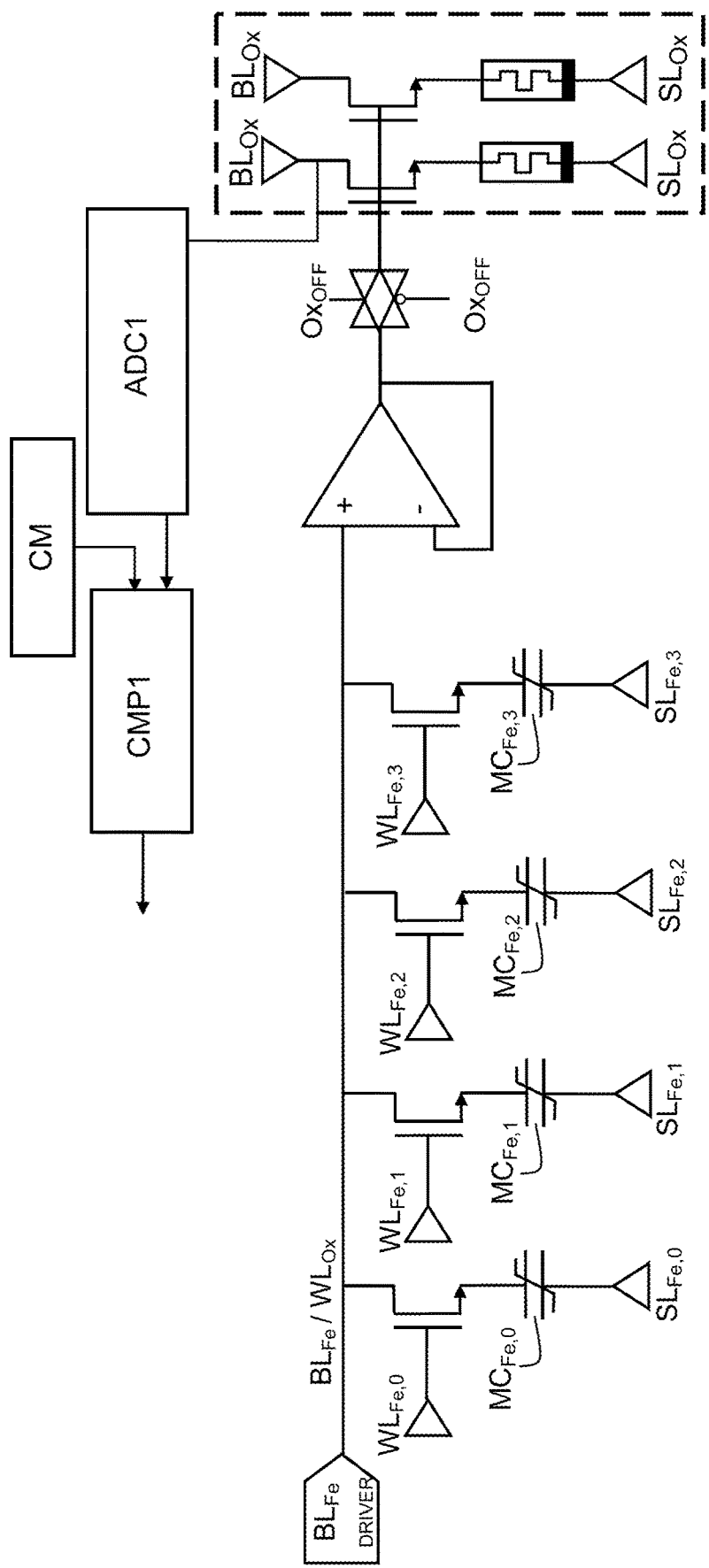
FIG. 7a shows a first example of the data transfer stage with verification means according to any embodiment of the invention.

After the transfer operation, a comparison step is executed between the copy of the data in the cache memory CM and the transferred data in the target OxRAM memory unit. This comparison aims to verify if the transfer operation succeeded taking into account the stochastic aspect of multilevel OxRAM technology. FIG. 7a shows a first example of the data transfer stage with digital verification means according to any embodiment of the invention. The data storage circuit MEM comprises further an Analog-to-Digital Convertor ADC1 to convert the analog data in the target OxRAM memory unit into a digital signal. The data storage circuit MEM comprises further a digital comparator to compare the cached data with the digital form of the data provided to the target OxRAM unit. The comparison is realized in the digital domain.

Figure 7B:
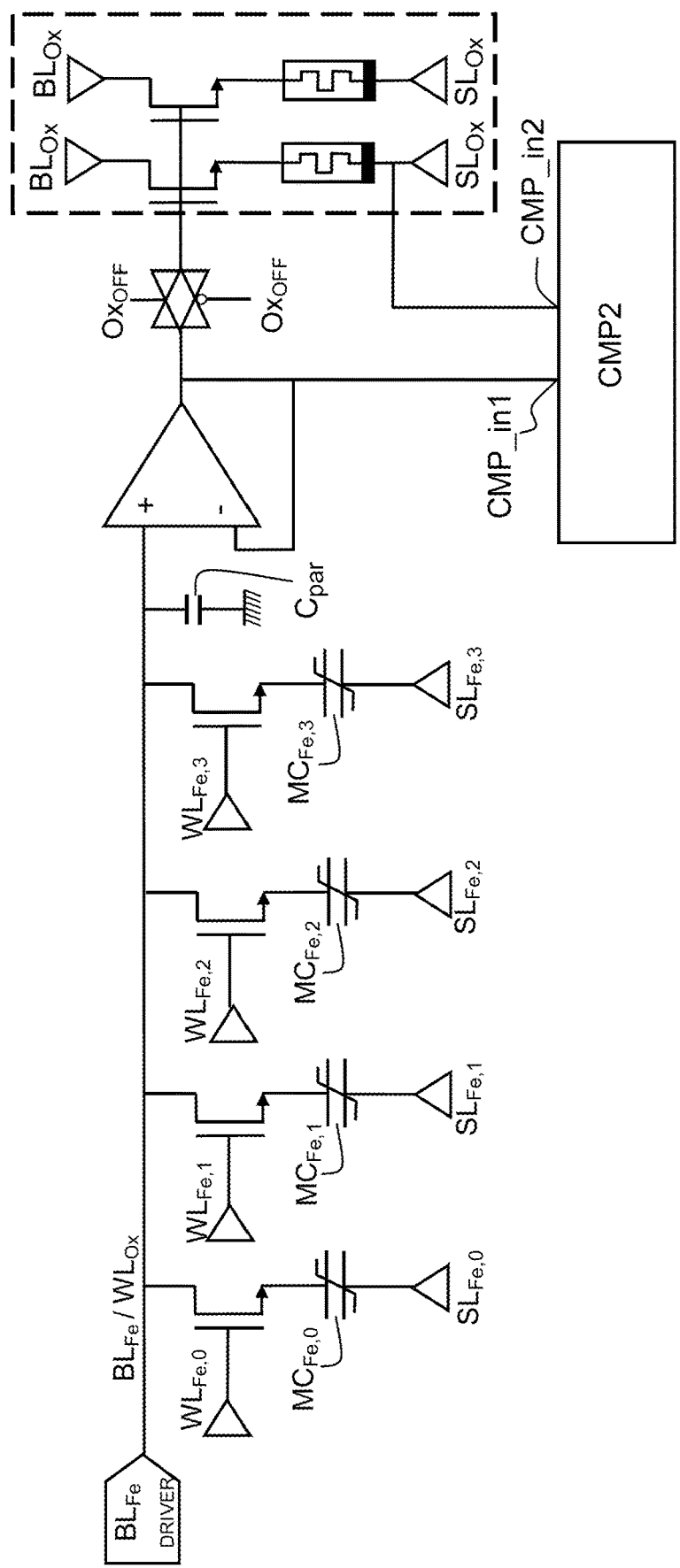
FIG. 7b shows a second example of the data transfer stage with verification means according to an embodiment of the invention.

Alternatively, FIG. 7b shows a second example of the data transfer stage with analog verification means according an embodiment of the invention. The data storage circuit MEM comprises a comparator CMP2 with two threshold voltages $Vth^+$ and $Vth^-$. The analog verification means are compatible with the embodiments comprising a voltage follower VF wherein the parasitic capacitance $C_{par}$ is used as cache memory CM. The read data from the source FeRAM units is stored in the parasitic capacitance $C_{par}$ during the whole process. The first input of the comparator CMP_in1 receives the output $V_{data}$ of the voltage follower VF and the second input of the comparator CMP_in2 receives the voltage $V_{read}$ measured across the target OxRAM after the transfer. Thus, the comparator CMP2 is set to verify that the absolute value of the difference between $V_{read}$ and $V_{data}$ is between the threshold voltage $Vth^+$ and $Vth^-$.

The data storage circuit MEM is configured to react depending on the result of the verification step. If the result of the comparison confirms the success of the transfer (no difference between the cached data and the transferred data), the same process is repeated for another set of source FeRAM with another target OxRAM unit. Else, the content of the cache memory CM is copied in the initial set of source FeRAM units and the whole process is repeated.

The data transfer operation according to the invention has several advantages compared to the state of the art solutions.

Firstly, we consider the case where a synaptic weight encoded in N elements of the digital memory. In one hand, a transfer solution according to state of the art would require at least N clock cycles to complete the reading operation of the entire weight. On the other hand, in the proposed approach, the reading operation is performed at the same clock cycle by reading in parallel all elements of the memory array encoding the synaptic weight. In terms of energy and area savings, the proposed transfer solution does not necessarily require a sensing element in the digital memory at the transfer moment, to read the value of each memory element.

Secondly, in a transfer solution according to state of the art, after reading the synaptic weight, the transfer to the multi-level resistive cell would require a Digital to Analog Converter (DAC) in order to tune the programming voltage of the multi-level resistive cell to an equivalent digital value. On the contrary, the transfer solution according to the invention completely avoids the implementation of a Digital to Analog Converter, as the conversion is performed at the same time with the reading operation.

Thirdly, we remind that the process variability of the memory cells might require several iterative programming steps. Therefore, in a transfer solution according to the state of the art, the Digital to Analog Converter (DAC) output should be maintained until a memory cell is programmed to the correct conductance value. In transfer approach according to the invention, several ReRAM devices could be programmed in parallel, without any area overhead.

Figure 8A:
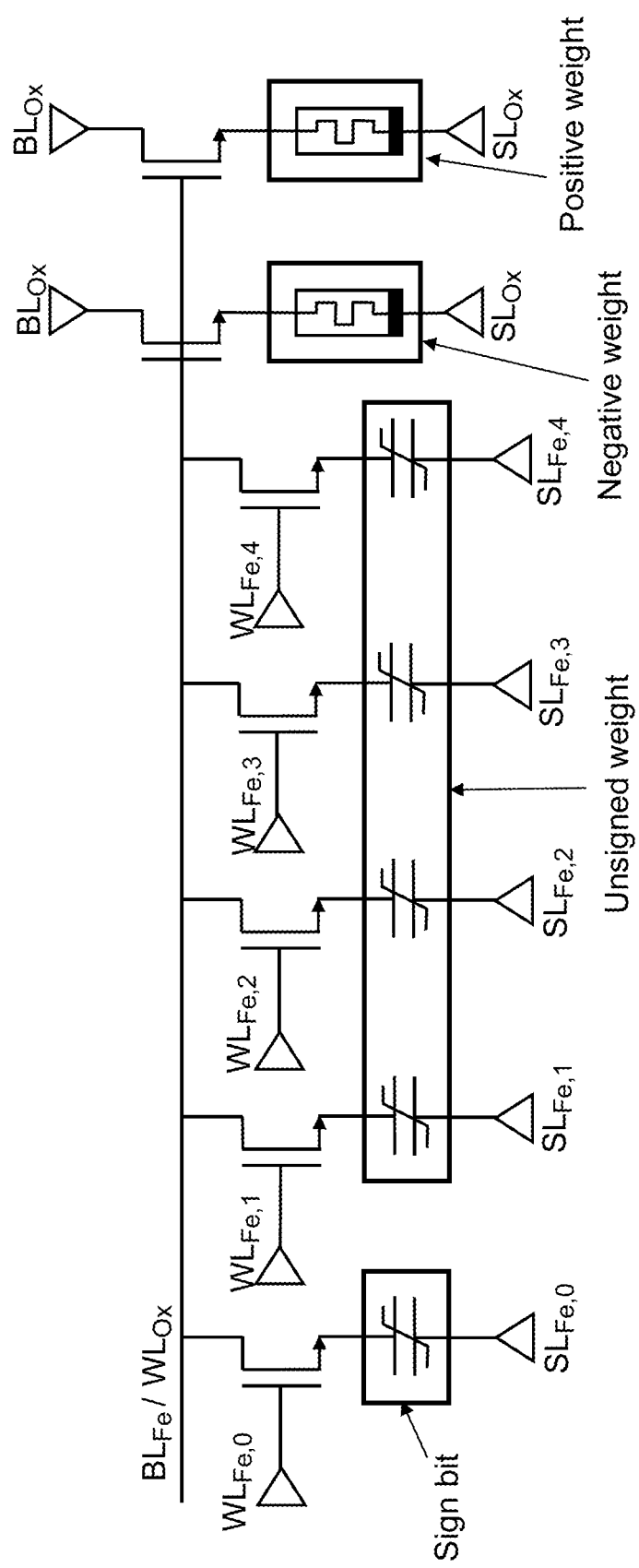
FIG. 8a shows a first example of the data storage circuit according to any embodiment of the invention suitable for signed data storing.

FIG. 8a shows a first example of the data storage circuit according to any embodiment of the invention suitable for signed data storing. The whole description presented up to this point considers the possibility to map unsigned data only. For the system to take into account positive and negative data, a 2T2R configuration can be used for the inference OxRAM part. By using two OxRAM memory units, one can be fully dedicated to map positive weight values and the other one for negative ones. On the other hand, for the data stored in the FeRAM array $MEM_{FE}$ during the learning phase, the sign can be stored in an additional FeRAM memory unit sharing the same bit line with the source FeRAM units previously described. In particular, if the sign dedicated FeRAM is set to 0, a positive weights is stored in the nearby FeRAM devices. If the sign FeRAM device is set to 1, the stored weight is negative.

Figure 8B:
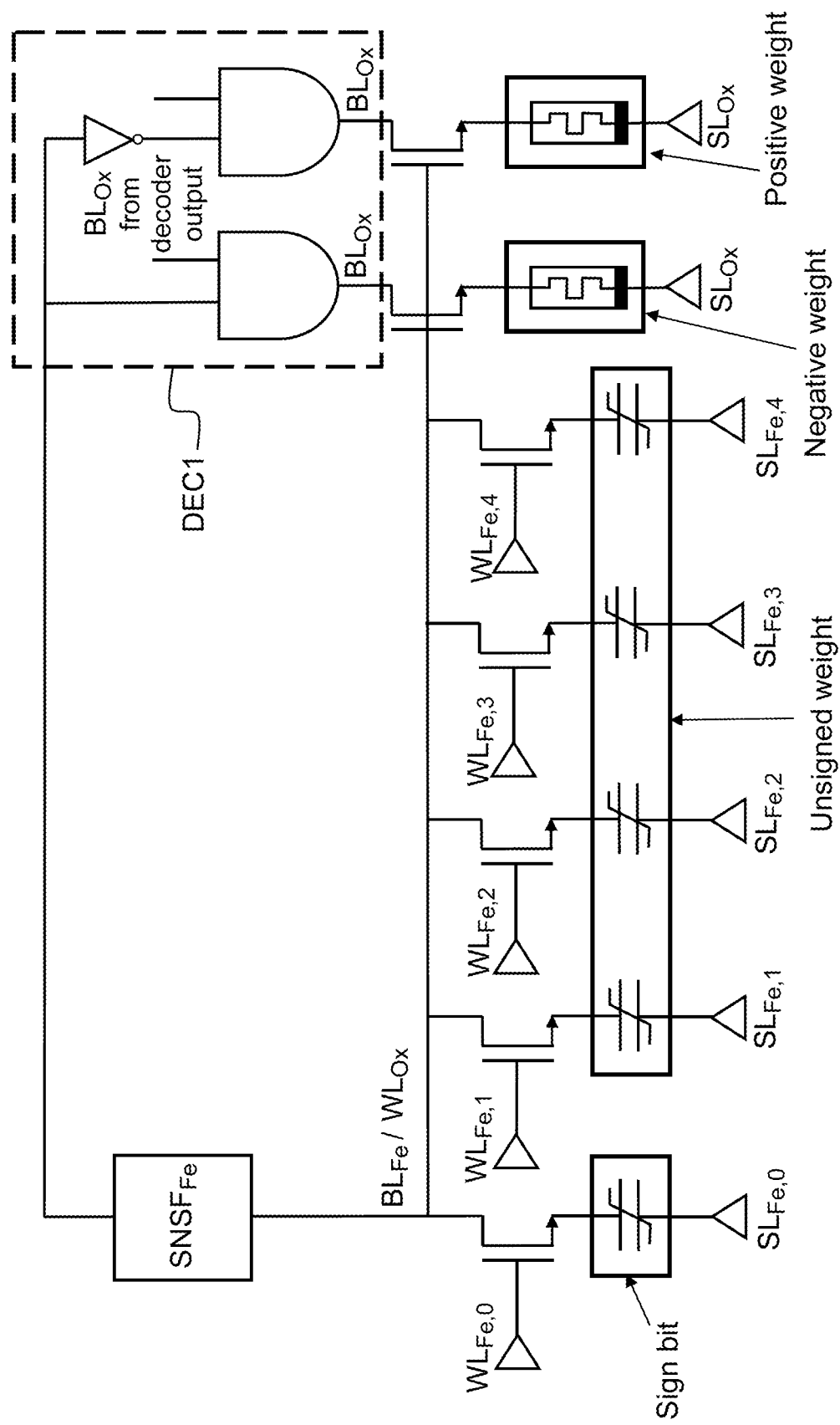
FIG. 8b shows the first example of the data storage circuit according to any embodiment of the invention suitable for signed data transfer.

FIG. 8b shows the first example of the data storage circuit according to any embodiment of the invention suitable for signed data transfer. In this case the data transfer stage TR comprises further a digital decoder DEC1 configured to select the target OxRAM unit depending on the sign of the data to be transferred.

When transferring the weight from the FeRAM to the OxRAM array, the sign of the stored weight has to be taken into account in order to decide which one of the OxRAM devices in the 2T2R cell has to be programmed. This can be done by sequentially reading the sign bit and the unsigned weight value. The sign bit is read with the FeRAM sensing circuit $SNS_{Fe}$. The sensed value is used, together with the decoder output, to select the correct bit line to program between the positive and negative $BL_{Ox}$. The unsigned weight value is then transferred from the FeRAM to the OxRAM array as described in the previous paragraphs. The unselected device in the 2T2R cell should be left in a RESET state.

While specific embodiments have been described herein, it will be apparent to a person skilled in the art that other embodiments may be provided that fall within the scope of the claims. Features of one embodiment may be appropriately combined with those of one or more other embodiments.

The invention claimed is:

1. A data storage circuit (MEM) comprising:
a first memory array ($MEM_{FE}$) comprising a plurality of FeRAM memory units;
a second memory array ($MEM_{Ox}$) comprising a plurality of OxRAM memory units;
each of the first and second memory arrays ($MEM_{FE}$, $MEM_{Ox}$) comprising: a plurality of word lines ($WL_{i,Ox}$, $WL_{j,Fe}$), a plurality of source lines ($SL_{i,Ox}$, $SL_{j,Fe}$) and a plurality of bit lines ($BL_{j,ox}$, $BL_{j,Fe}$);
for each column ($C_{j,ox}$, $C_{j,Fe}$) each memory unit ($MU_{ox,ij}$ $MU_{Fe,ij}$) comprising:
a memory cell ($MC_{Ox}$, $MC_{Fe}$) having a first electrode (EL1, EL1') and a second electrode (EL2, EL2') connected to the source line ($SL_{j,Ox}$, $SL_{j,Fe}$) associated to said memory unit;
a selection transistor (T1) having a gate connected to the word line ($WL_{i,ox}$, $WL_{i,Fe}$) associated to said memory unit and placed in series with the memory cell between the source line (SL) and a bit line ($BL_{j,ox}$, $BL_{j,Fe}$) associated to of said memory unit;
said data storage circuit (MEM) comprising further:
a data transfer stage (TR) configured to transfer data from a set of source FeRAM memory units ($MU_{Fe,ij}$) having a common bit line ($BL_{j,Fe}$) to a target OxRAM unit ($MU_{ox,ij}$) by converting a read signal ($VB_{j,Fe}$) from said common bit line ($BL_{j,Fe}$) to a transfer voltage (VTR) applied on a target line of the target OxRAM unit ($MU_{ox,ij}$), said target line corresponding to the word line ($WL_{i,ox}$) or the source line ($SL_{j,ox}$) and having the same direction as said common bit line ($BL_{j,Fe}$).

2. The data storage circuit (MEM) according to claim 1 comprising further:
a reading stage ($WL_{Fe}$ DRV, $SL_{Fe}$ DRV, $WL_{Ox}$ DRV, $SL_{Ox}$ DRV) data for each one of the first memory array ($MEM_{FE}$) and the second memory array ($MEM_{OX}$);
a writing stage ($WL_{Fe}$ DRV, $SL_{Fe}$ DRV, $BL_{Fe}$ DRV, $WL_{Ox}$ DRV, $SL_{Ox}$ DRV, $BL_{Ox}$ DRV) data for each one of the first memory array ($MEM_{FE}$) and the second memory array ($MEM_{Ox}$);
a controlling unit (CTRL) configured to:
command the reading stage to read the content of the set of source FeRAM memory units ($MU_{Fe,ij}$)
activate the data transfer stage (TR) and applying a SET operation on the target OxRAM unit ($MU_{ox,ij}$).

3. The data storage circuit (MEM) according to claim 2, wherein the first memory array ($MEM_{FE}$), the second memory array ($MEM_{OX}$) and the data transfer stage (TR) are produced on a same chip.

4. The data storage circuit (MEM) according to claim 2, wherein:
each of the source FeRAM memory units ($MU_{Fe,ij}$) contains a binary data;
the target OxRAM unit ($MU_{ox,ij}$) is programmable according to at least three conductance states;
and wherein the data transfer stage (TR) is configured to convert the number of source FeRAM memory units ($MU_{Fe,ij}$) containing a high logical state to a corresponding conductance state in the target OxRAM unit ($MU_{ox,ij}$).

5. The data storage circuit (MEM) according to claim 2, wherein the data transfer stage (TR) comprises a capacitive element ($C_{BL}$) between said common bit line ($BL_{j,Fe}$) and an electrical ground (GND); said capacitive element ($C_{BL}$) forming a capacitive voltage divider with the set of source FeRAM memory units ($MU_{Fe,ij}$).

6. The data storage circuit (MEM) according to claim 2, wherein the data transfer stage (TR) comprises an isolating switch (N2, PG1) between said common bit line ($BL_{j,Fe}$) of the set of source FeRAM memory units ($MUFE_{ij}$) and the word line ($WL_{i,ox}$) of the target OxRAM unit ($MU_{ox,ij}$).

7. The data storage circuit (MEM) according to claim 2, wherein the data transfer stage (TR) comprises a reset switch (N3) between the word line ($WL_{i,ox}$) of the target OxRAM unit ($MU_{ox,ij}$) and an electrical ground (GND).

8. The data storage circuit (MEM) according to claim 2, wherein the data transfer stage (TR) comprises a voltage follower circuit (VF) having:
an input (I1) connected to the common bit line ($BL_{j,Fe}$) of the set of source FeRAM memory units ($MUFE_{ij}$), and an output (O1) connected to the word line ($WL_{i,ox}$) or on the source line ($SL_{j,ox}$) of the target OxRAM unit ($MU_{ox,ij}$).

9. The data storage circuit (MEM) according to claim 2, comprising further a cache memory (CM) to temporary store a copy of data provided from the set of source FeRAM memory units ($MUFE_{ij}$) during the transfer.

10. The data storage circuit (MEM) according to claim 9, wherein the cache memory (CM) is implemented with a subset of FeRAM memory units from the first memory array ($MEM_{FE}$).

11. The data storage circuit (MEM) according to claim 9, wherein the cache memory (CM) is implemented with a plurality of latch circuits (LTCH).

12. The data storage circuit (MEM) according to claim 9, further comprising a comparator (CMP1, CMP2) configured to compare:
the data stored in the target OxRAM unit ($MU_{ox,ij}$) after a transfer to the copy data stored in the cache memory.

13. A computing circuit (CALC) for executing a computational algorithm involving a numerical variable (w) in at least two phases of operation;
the first phase of operation requiring a higher number of writing operations of said numerical variable (w) than the second phase of operation;
the second phase of operation requiring a higher number of reading operations of said numerical variable (w) than the second phase of operation;
said computer circuit comprising a data storage circuit (MEM) according to claim 2, wherein the controlling unit (CTRL)) configured to:
command the reading and the writing stage to use the data stored in the first memory array ($MEM_{FE}$) during the first phase,
command the reading and the writing stage and the data transfer stage (TR) to perform a data transfer operation from the first memory array ($MEM_{FE}$) to the second memory array ($MEM_{OX}$);
command the reading and the writing stage to use the data stored in the second memory array ($MEM_{OX}$) during the second phase.

14. The computing circuit (CALC) according to claim 13 configured to implement an artificial neural network, the neural network being composed of a succession of layers each consisting of a set of neurons, each layer being associated with a set of synaptic coefficients ($w_{i,j}$), wherein:
the numerical variables are the synaptic coefficients of the neural network,
the first phase of operation is a learning phase;
the second phase of operation is an inference phase.

15. The data storage circuit (MEM) comprising:
a first memory array ($MEM_{FE}$) comprising a plurality of FeRAM memory units;
a second memory array ($MEM_{Ox}$) comprising a plurality of OxRAM memory units;
each of the first and second memory arrays ($MEM_{FE}$, $MEM_{OX}$) comprising: a plurality of word lines ($WL_{j,ox}$, $WL_{j,Fe}$), a plurality of source lines ($SL_{j,ox}$, $SL_{j,Fe}$) and a plurality of bit lines ($BL_{j,ox}$, $BL_{j,Fe}$),
for each column ($C_{j,ox}$, $C_{j,Fe}$) each memory unit ($MU_{ox,ij}$ $MU_{Fe,ij}$) comprising:
a memory cell ($MC_{Ox}$, $MC_{Fe}$) having a first electrode (EL1, EL1') and a second electrode (EL2, EL2') connected to the source line ($SL_{j,ox}$, $SL_{j,Fe}$) associated to said memory unit;
a selection transistor (T1) having a gate connected to the word line ($WL_{i,ox}$, $WL_{i,Fe}$) associated to said memory unit and placed in series with the memory cell between the source line (SL) and a bit line ($BL_{j,ox}$, $BL_{j,Fe}$) associated to of said memory unit;
said data storage circuit (MEM) comprising further:
a data transfer stage (TR) configured to transfer data from a set of source FeRAM memory units ($MU_{Fe,ij}$) having a common bit line ($BL_{j,Fe}$) to a target OxRAM unit ($MU_{ox,ij}$) by converting a read signal ($VBL_{j,Fe}$) from said common bit line ($BL_{j,Fe}$) to a transfer voltage (VTR) applied on a target line of the target OxRAM unit ($MU_{ox,ij}$), said target line corresponding to the word line ($WL_{i,ox}$) or the source line ($SL_{j,ox}$) and having the same direction as said common bit line ($BL_{j,Fe}$);
the first memory array ($MEM_{FE}$), the second memory array ($MEM_{OX}$) and the data transfer stage (TR) being produced on a same chip.

* * * * *